(12) United States Patent
Fujiwara et al.

(10) Patent No.: US 6,897,415 B2
(45) Date of Patent: May 24, 2005

(54) WORKPIECE STAGE OF A RESIST CURING DEVICE

(75) Inventors: Yoshinori Fujiwara, Yamato (JP); Yasuhiko Kenjo, Yokohama (JP); Yoshihiko Watanabe, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 8 days.

(21) Appl. No.: 10/180,295

(22) Filed: Jun. 27, 2002

(65) Prior Publication Data

US 2003/0017713 A1 Jan. 23, 2003

(30) Foreign Application Priority Data

Jul. 2, 2001 (JP) ........................................ 2001-201444

(51) Int. Cl.$^7$ ................................................. H05B 3/68
(52) U.S. Cl. ..................................... 219/444.1; 219/548
(58) Field of Search .......................... 219/443.1, 444.1, 219/548; 118/724, 725; 112/345.51, 345.52, 345.53

(56) References Cited

U.S. PATENT DOCUMENTS

| | | | |
|---|---|---|---|
| 4,842,992 A | | 6/1989 | Arai |
| 5,199,483 A | * | 4/1993 | Bahng ........................ 165/80.1 |
| 5,891,253 A | * | 4/1999 | Wong et al. ................. 118/726 |
| 6,063,203 A | * | 5/2000 | Satoh ........................... 118/726 |

FOREIGN PATENT DOCUMENTS

| | | |
|---|---|---|
| EP | 1 119 028 A1 | 7/2001 |
| JP | 63-1327 | 1/1988 |
| JP | 63-39931 | 3/1988 |
| JP | 63-162524 | 10/1988 |

* cited by examiner

*Primary Examiner*—Sang Y. Paik
(74) *Attorney, Agent, or Firm*—Nixon Peabody LLP; David S. Safran

(57) ABSTRACT

A workpiece stage of a resist curing device is devised in which a workpiece on which a resist has been applied is held on a workpiece stage by vacuum suction, in which the workpiece is irradiated with UV radiation with a simultaneous temperature increase, in which it is cooled after UV radiation and by which the resist is cured, the workpiece stage having heating and cooling arrangements, major warping of the carrier is avoided and reliable holding of the workpiece on the carrier surface by vacuum suction obtained by the carrier being made of an aluminum alloy or a copper alloy which meets the following condition:

$$\sigma/\sigma_y \leq 3.1$$

$\sigma$ labeling the thermal stress which is determined using the following formula:
where E is Young's modulus (N/mm$^2$) at 200° C., $\alpha$ is the coefficient of linear expansion (1/° C.) at 200° C. and $\Delta T$ is a temperature difference (° C.) of 120° C., and $\sigma_y$ is the fracture point at 200° C.

3 Claims, 4 Drawing Sheets

WORKPIECE STAGE OF A RESIST CURING DEVICE

BACKGROUND OF THE INVENTION

1. Field of the Invention

The invention relates to a workpiece stage of a resist curing device in which a workpiece on which a resist has been applied, such as a semiconductor wafer or the like, is held on a workpiece stage, and in which the resist is cured by heating and UV radiation. The invention furthermore relates to a workpiece stage of a resist curing device which is used in production processes for an integrated semiconductor circuit for resist treatment, in which a resist which has been applied to the wafer of silicon or the like is cured by UV radiation with a simultaneous increase of temperature by heating.

The workpiece stage in accordance with the invention is advantageously used especially as a new, high-efficiency workpiece stage which corresponds to an increase in the diameter of the wafer.

2. Description of the Prior Art

Conventionally, in production processes for an integrated semiconductor circuit the process for treatment of the resist which has been applied to the semiconductor wafer was a process in which the resist, after development with a simultaneous temperature increase, is irradiated by heating with UV radiation, in which the resist is cured, and in which thus its thermal resistance and plasma resistance and the like are increased (for example, Japanese patent HEI 4-78982, corresponding to U.S. Pat. No. 4,842,992). In the above described treatment, for each wafer, while UV radiation is performed, at the same time the temperature of the wafer treatment rack (of a workpiece stage) is controlled and the temperature increase and decrease described below is repeated.

In the above described process for treatment of a resist a series of treatments is carried out, specifically:

Treatment is started for example at 50° C. to 100° C.;

UV irradiation raises the temperature from 200° C. to 250° C.;

UV irradiation is stopped;

Cooling is performed again to a temperature from 50° C. to 100° C.; and

Treatment is concluded.

In this case, the rate of temperature increase for a process-dictated reason must be 1° C./sec to 2° C./sec. It is desirable for the rate of temperature decrease to be higher in order to increase the throughput; but, in practice, the decrease is roughly 3° C./sec.

In order to reliably transfer the above described rapid temperature increase and decrease to the wafer, advantageously a process is undertaken in which the wafer is held by vacuum suction on a metallic workpiece stage with good thermal conductivity. Specifically, for this workpiece stage, one is used with a temperature control means which has a heating means and a cooling means. It is heated by a heating apparatus and cooled with cooling water. In this way, the control of the above described temperature increase and decrease is carried out.

As generic art, FIG. 1 shows a normal workpiece stage in an overall perspective view. The workpiece stage WS has a circular shape like the wafer. On the surface of the workpiece stage WS, there are several annular vacuum suction grooves A. The wafer to which the vacuum is supplied and which was put in place is held by the surface of the workpiece stage WS by vacuum suction. Cartridge heaters B are inserted into the workpiece stage. The surface of the workpiece stage is provided with a non-electrolytic nickel coating 2.

In FIG. 6(a), the workpiece stage WS is shown in a side view, FIG. 6(b) shows a cartridge heater B in a cross section. The side of the workpiece stage WS is provided with several through openings 3 for insertion of heaters, into which rod-shaped cartridge heaters B are inserted. Cartridge heaters B have a cartridge 7 which corresponds to the length of the through opening, and a heating wire 8. When current is supplied, the cartridge heater B is heated, and the workpiece stage WS is heated by thermal conduction.

Within the workpiece stage, between the through openings 3 for inserting the heaters B, there are through openings 4 for cooling water through which cooling water flows, and a vacuum supply line (not shown in the drawings) by which a vacuum is drawn through the vacuum suction grooves 5. The passages through which cooling water flows are connected to one another on the bottom of the workpiece stage WS by bridge pipelines 6. The cooling water is introduced via the insertion openings E at two points and drained by drain openings F at two points.

However, recently there has been a tendency to increase the diameter of the wafer from 200 mm to 300 mm, by which the diameter of the workpiece stage must be increased accordingly. When the diameter of the workpiece stage increases, the following disadvantages arise:

Conventionally, the material of the above described workpiece stage of the resist curing device has been low-oxygen copper with good thermal conductivity. By increasing the diameter of the carrier in order to handle a wafer with a large diameter of 300 mm in a suitable manner, due to repetition of the process of increasing and decreasing the temperature of the carrier, a warp was formed due to bowing of the carrier (FIG. 2), resulting in the disadvantage that the wafer could no longer be held by drawing a vacuum.

For example, when the temperature is increased and decreased roughly 100 times between 50° C. and 250° C. (2.1° C./sec rate of temperature increased and 3° C./sec rate of temperature decrease) in a workpiece stage WS of low-oxygen copper with a diameter of 320 mm and a thickness of 17 mm, as is shown in FIG. 2, the disadvantage arises that, with respect to the center area of the workpiece stage, an warp of 1.2 mm forms in the peripheral area.

The inventors have ascertained by tests that a wafer cannot be reliably held by drawing a vacuum if the warp of the peripheral area with respect to the center area of the workpiece stage greater than 0.5 mm. If the wafer cannot be held on the workpiece stage by vacuum, the temperature of the carrier cannot be conducted exactly to the wafer. It is possible for a disadvantage to arise in the curing treatment of the resist.

SUMMARY OF THE INVENTION

The invention was devised in order to eliminate the above described disadvantages in the prior art. The object of the invention is to develop a new workpiece stage with high efficiency, in which, even when the diameter of the wafer is increased, the disadvantage that bowing of the workpiece stage occurs does not arise. In a workpiece stage of a resist curing device in which a resist, which has been applied to a wafer with a high diameter of, for example, 300 mm, is irradiated with UV radiation with simultaneous heating and cured, the object of the invention is specifically to devise a new workpiece stage of a resist curing device with high efficiency, which makes it possible for the warping of the peripheral area with respect to the center area of the carrier on which the wafer is placed to be less than or equal to 0.5 mm, even if the temperature increase and decrease of, for example, between 50° C. and 250° C. of a workpiece stage with a diameter of at least 300 mm, for example, 320 mm, which corresponds to a wafer with a large diameter, is repeated.

The object is achieved in accordance with the invention by the following technical means:

(1) The workpiece stage of a resist curing device in which a workpiece on which a resist has been applied is held on a workpiece stage by vacuum, in which the workpiece is irradiated with UV radiation with a simultaneous temperature increase, in which, after UV radiation, cooling is performed, and in which the above described resist is cured, the workpiece stage having a heating means and a cooling means, characterized in that the above described carrier is made of an aluminum alloy or a copper alloy which meets the following condition $\sigma/\sigma_y$ 3.1, $\sigma$ being the thermal stress which is determined using the following formula:

$\sigma = E\alpha\Delta T$ (E: Young's modulus (N/mm$^2$) at 200° C., $\alpha$: coefficient of linear expansion (1/° C.) at 200° C., $\Delta T$: temperature difference (° C.)=120° C.), and $\sigma_y$ being the fracture point at 200° C.

(2) Workpiece stage of a resist curing device according to (1), characterized in that the material of the workpiece stage is the aluminum alloy A6061P or A5052P.

The invention is further described below using the drawings.

BRIEF DESCRIPTION OF THE DRAWINGS

FIG. 6(*b*) shows a cross section of a cartridge heater.

DETAILED DESCRIPTION OF THE INVENTION

The inventors envisioned that the cause of the warping of the peripheral area with respect to the center area of the carrier in the workpiece stage of a resist curing device is the following, and have checked various conditions under which warping does not form.

The inventors thought in the course of the tests that the reason for warping of a workpiece stage is the following:

When the temperature increases and decreases, a temperature difference arises in the carrier. This causes local thermal stress. When this local thermal stress exceeds the fracture point (elasticity limit) of the metal of the carrier, a residual local change of shape, which becomes warping of the carrier, occurs.

Figure 6A:
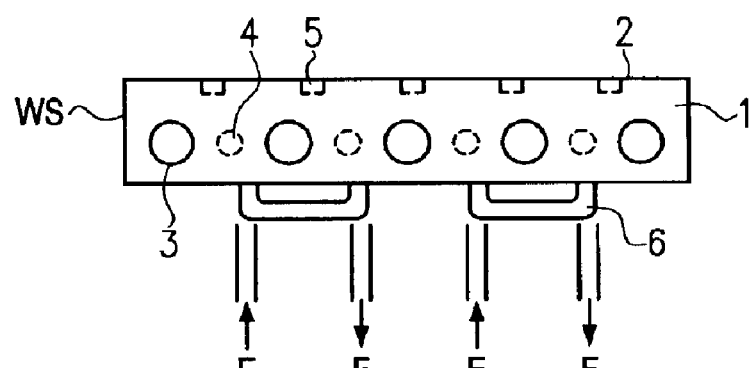
FIG. 6(*a*) shows a side view of a known workpiece stage.
Figure 6B:
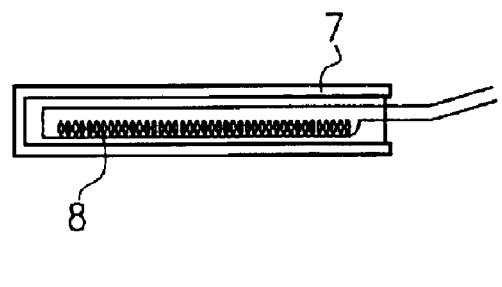

In particular, when the temperature decreases, a carrier with an overall temperature from 200° C. to 250° C. with a diameter of 320 mm and a thickness of 17 mm is cooled by the inflow of cooling water which is tap water, even if the cooling water is supplied from two points, as is shown in FIG. 6, immediately after feed between the vicinity of the cooling water feed openings and the area away from the cooling water feed openings, a great temperature difference forms. Therefore, a large temperature gradient arises in the workpiece stage.

Figure 1:
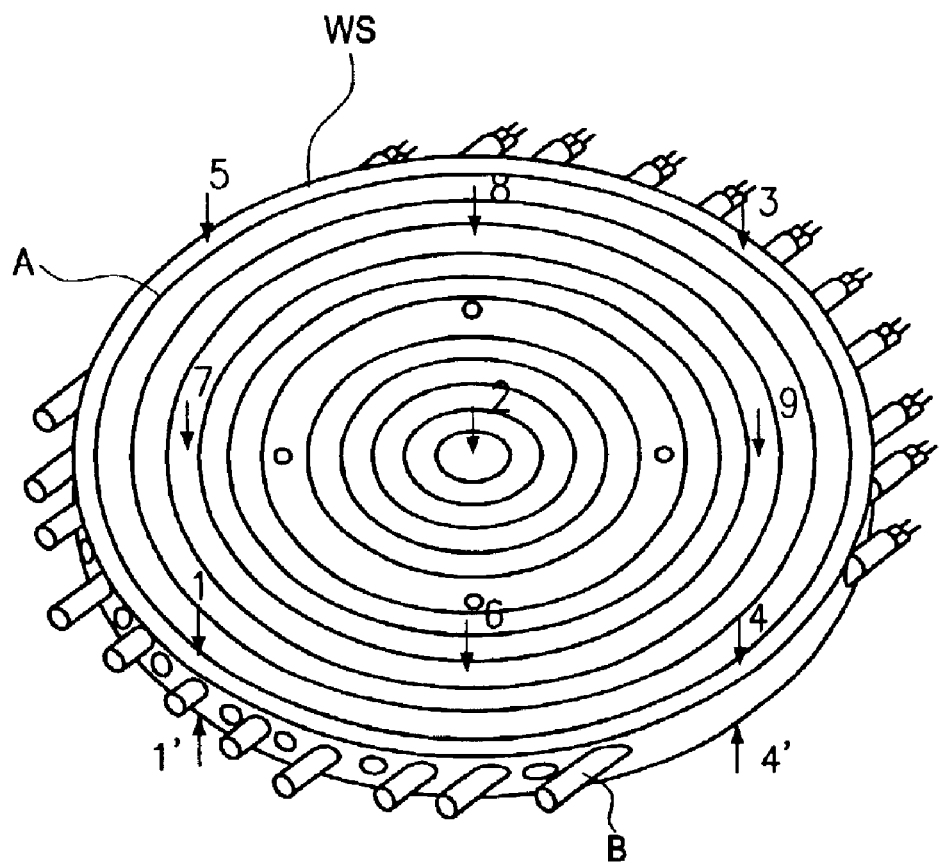
FIG. 1 is a perspective view of a known workpiece stage.
Figure 2:
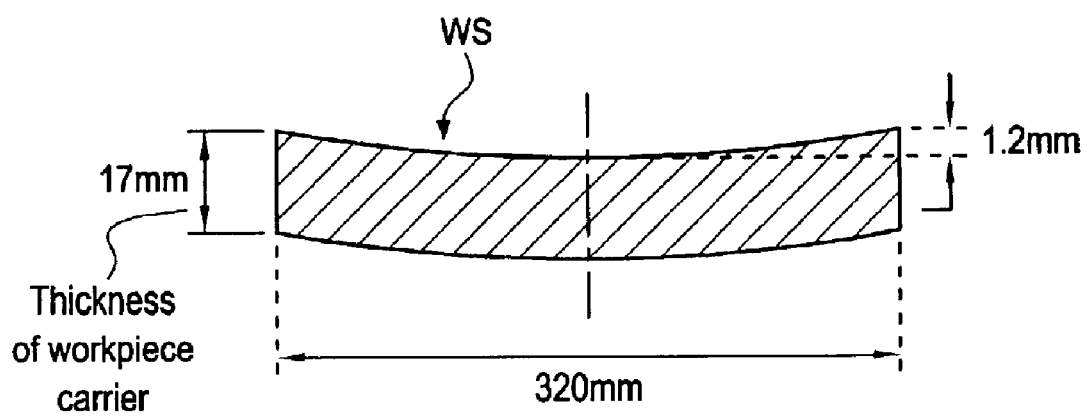
FIG. 2 is a cross section of a known workpiece stage which has bowed.
Figure 3:
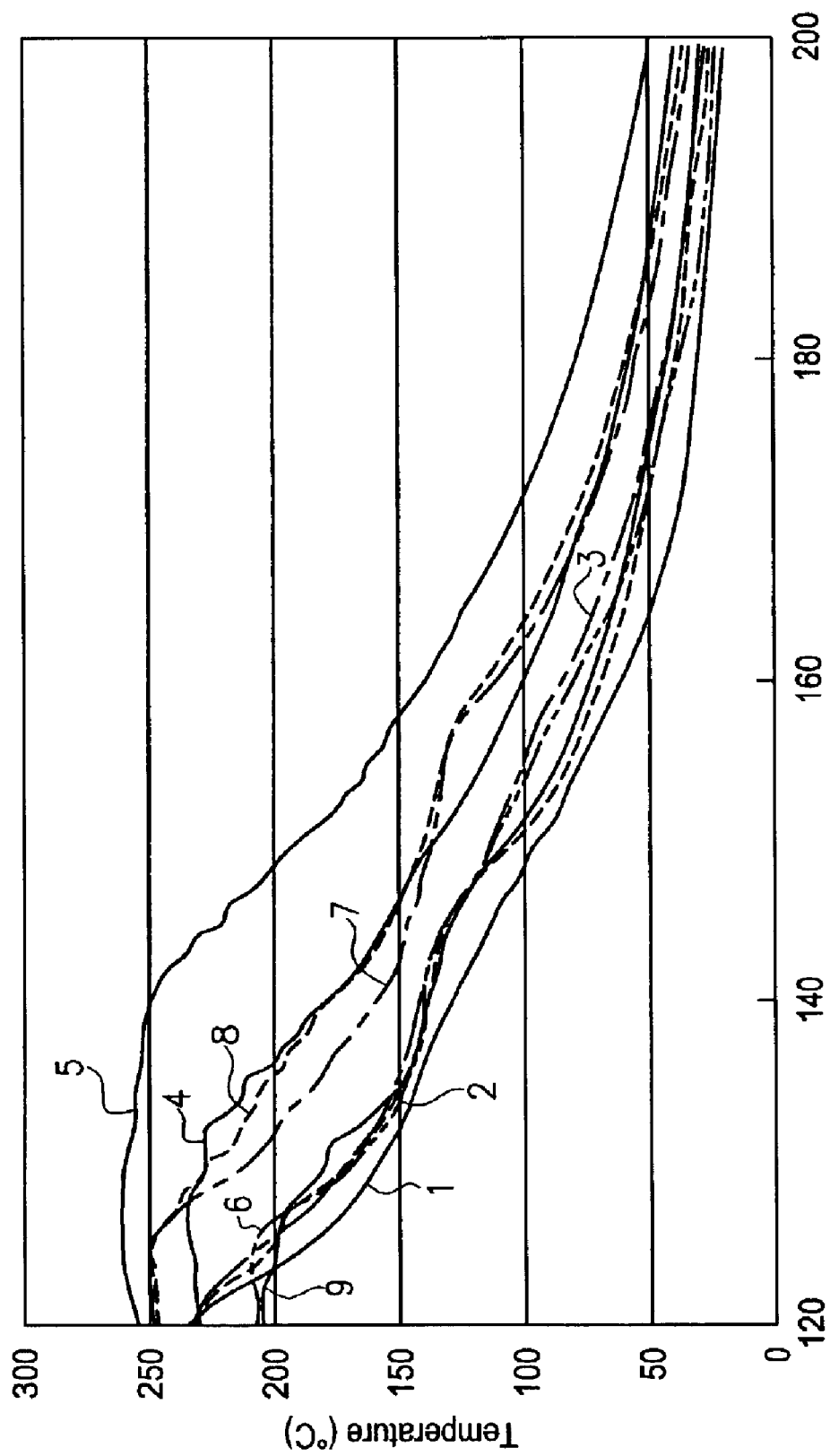
FIG. 3 is a graph showing the relation between the surface temperature of the carrier and the time after the start of cooling.

Therefore, in order to study the temperature gradient in a workpiece stage, the carrier was heated to 250° C., cooling water of roughly 20° C. was supplied and the temperature of the respective area of the carrier measured. FIG. 3 shows the result. In the figure, the y-axis plots the surface temperature and the x-axis plots the time starting from the initiation of cooling. The temperature measurement points are the areas shown using arrows 1 to 9 in FIG. 1. FIG. 3 shows that a maximum temperature difference $\Delta T$ of roughly 120° C. arises. Based on the above described results, the stress $\sigma$ which arises in the carrier was computed. The stress $\sigma$ was determined using the following formula:

$$\sigma = E\epsilon = E\alpha\Delta T$$

where $\sigma$ is the stress (N/mm$^2$), E is Young's modulus (N/mm$^2$), $\epsilon$ is warping, $\alpha$ is the coefficient of linear expansion (1/° C.), and $\Delta T$ is the temperature difference (° C.).

Depending on the relation between the stress $\sigma$ which has been determined by the above described formula and the fracture point $\sigma_y$, it becomes apparent how easily the carrier is warped. Here, the frequency of warping should be evaluated in the high temperature state. Therefore, for Young's modulus E and the coefficient of linear expansion $\alpha$ which are inserted into the above described formula, values at 200° C. and for the temperature difference $\Delta T$, the actually measured value of 120° C. according to FIG. 3 are used.

Table 1 shows the result of the computation which was done based on the above described description for metals of different materials, $\sigma/\sigma_y$ shows how many times greater the stress $\sigma$ which forms in the carrier is than the fracture point (elastic limit) $\sigma_y$ at 200° C.

TABLE 1

| Material (JIS type number) | | $\alpha$ (1/°C.) | E (N/mm$^2$) | $\sigma$ (N/mm$^2$) | $\sigma y$ (N/mm$^2$) | $\sigma/\sigma_y$ |
|---|---|---|---|---|---|---|
| Low-oxygen copper | C1020P | 18.4 × 10$^{-6}$ | 111 × 10$^3$ | 227 | 30 | 7.6 |
| Aluminum alloy | A5052P | 24.4 × 10$^{-6}$ | 62 × 10$^3$ | 182 | 59 | 3.1 |
| | A6061P | 24.4 × 10$^{-6}$ | 60 × 10$^3$ | 176 | 84 | 2.2 |
| | A2024P | 24.4 × 10$^{-6}$ | 64 × 10$^3$ | 188 | 62 | 3.1 |
| | A2219P | 24.4 × 10$^{-6}$ | 64 × 10$^3$ | 188 | 158 | 1.2 |
| Copper Alloy | C6140P | 18.4 × 10$^{-6}$ | 114 × 10$^3$ | 252 | 198 | 1.3 |
| | C7060P | 16.0 × 10$^{-6}$ | 117 × 10$^3$ | 225 | 88 | 2.5 |

As was described above, the coefficient of linear expansion $\alpha$, Young's modulus E and the fracture point $\sigma_y$ are the values of the physical properties at 200° C. The stress $\sigma$ was computed based on the coefficient of linear expansion $\alpha$, Young's modulus E, and the temperature difference $\Delta$ of 120° C. As is shown in Table 1, in the case of a conventionally used low-oxygen copper (C1020P), the resulting thermal stress is at least seven times as great as the fracture point. Therefore it can be imagined that in the carrier a large residual change of shape with an amount of warp of 1.2 mm has formed.

In a conventional device, warping also occurred. However, the conventional device is one which corresponds to a wafer of less than or equal to 200 mm. The carrier diameter was 220 mm, therefore also small. The warp of the peripheral area with respect to the center area of the carrier was therefore also small, i.e., was less than or equal to 0.5 mm; this did not engender a problem.

Based on the above described circumstance, it can be envisioned that the warping which arises in the carrier is reduced by choosing a material such that the value of $\sigma/\sigma_y$ becomes as small as possible.

Therefore, the inventors produced a carrier of the aluminum alloy A6061P ($\sigma/\sigma_y=2.2$) and a carrier of the aluminum alloy A5052P ($\sigma/\sigma_y \leq 3.1$), temperature increases and decreases of 50° C.→250° C.→50° C. were repeated in the above described manner and the amount of warping of the peripheral area was measured with respect to the center area of the carrier.

Figure 4:
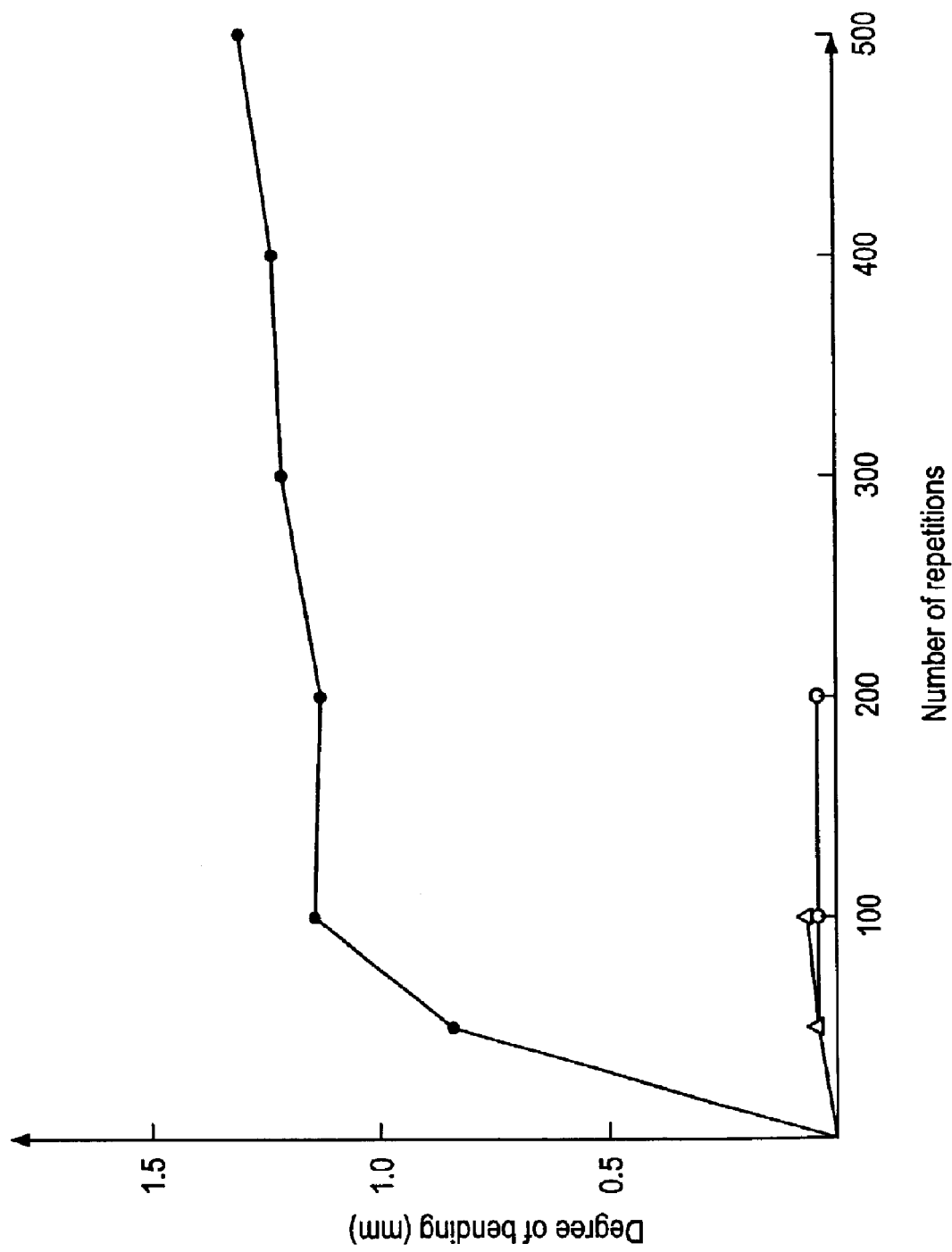
FIG. 4 is a graph showing the relation between the repetition frequency of the increase and decrease of temperature and the amount of warping of the carrier.

FIG. 4 shows the amount of warping of the carrier with respect to the frequency of repetition of the temperature increase and decrease. In the figure, the y-axis plots the amount of warping (mm of bending) of the carrier and the x-axis plots the repetition frequency of the temperature increases and decreases.

FIG. 4 shows (solid dot plot) the use of a low-oxygen copper (C1020P) as the material based on cases of a conventional carrier. The increase in the amount of warp when the temperature was increased and decreased 100 times was roughly 1.2 mm and it rose afterwards to a small extent. FIG. 4 shows the use of a A6061P as the material based on cases of a carrier (hollow dot plot) and the use of A5052P (triangle plot) as the material based on cases of a carrier. In the case of carrier using A6061P, when the temperature was increased and decreased 100 and 200 times the amount of warping of the carrier was less than or equal to 0.1 mm. It became apparent that a large warpage which would prevent suctioning of the wafer does not form.

In the case of a carrier using A5052P, when the temperature was increased and decreased 45 and 100 times the amount of warping of the carrier was less than or equal to 0.1 mm. It became apparent that a large warp which prevents suctioning of the wafer does not form.

There is the empirical law that in the case of a thermal stress, no warping occurs when $\sigma/\sigma_y$ is less than or equal to 2. This result does not contradict this empirical law.

As is shown in FIG. 4, the increase in the amount of warping in the case of a workpiece stage of low-oxygen copper (C1020P) is essentially saturated when the temperature was increased and decreased 100 times. Therefore, if the temperature was increased and decreased beyond 100 times major additional warping does not occur; this was not considered to be a problem.

Figure 5:
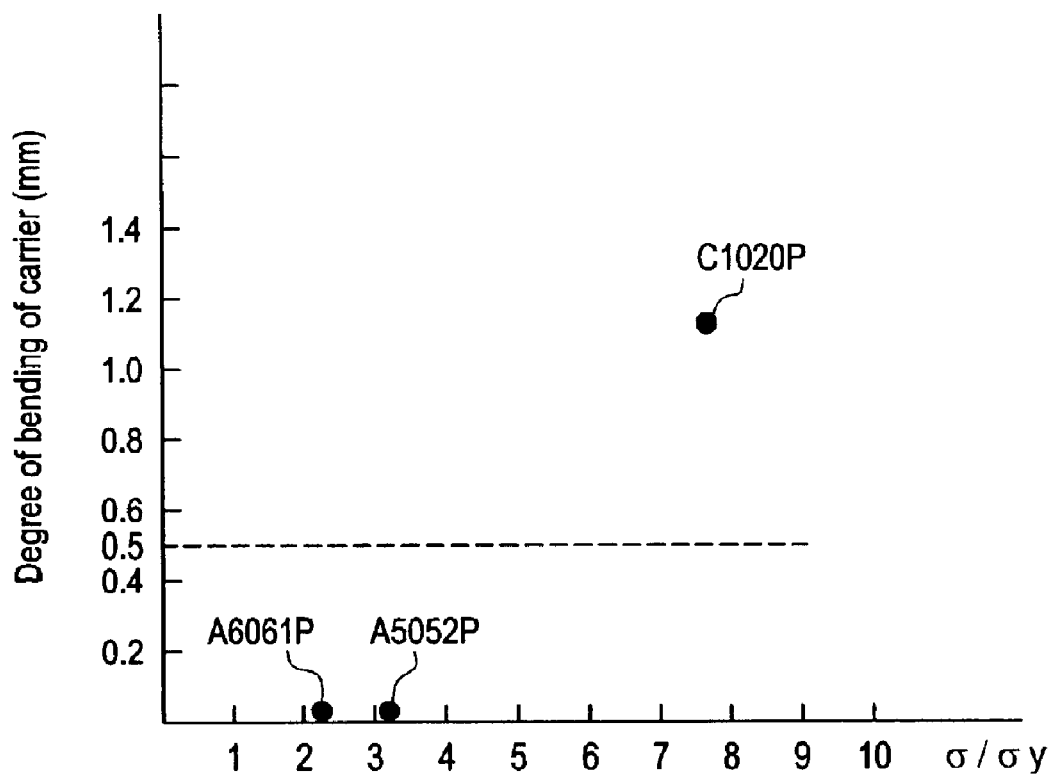
FIG. 5 shows the relation of the amount of warping of the carrier and the value $\sigma/\sigma_y$ when the temperature is increased and decreased 100 times.

FIG. 5 shows the amount of warpage of the workpiece stage with respect to $\sigma/\sigma_y$ (for a wafer with a diameter of 300 mm) when the temperature was increased and decreased 100 times. This was determined based on the above described test result in a workpiece stage of low-oxygen copper (C1020P) and in workpiece stages of aluminum alloys (A5052P, A6061P) and based on the above described value of $\sigma/\sigma_y$. The thermal stress $\sigma$ was computed based on the coefficient of linear expansion at 200° C., Young's modulus at 200° C. and the temperature difference of 120° C. $\sigma_y$ is the value of the physical property at 200° C.

As was described above, there is no disadvantage when the amount of warping of the workpiece stage is less than or equal to 0.5 mm, since here the wafer can be held securely by vacuum suction. Therefore, it was found that the use as the material of the carrier is possible when the value of $\sigma/\sigma_y$ is less than or equal to 3.1.

In Table 1, $\sigma/\sigma_y$, besides in low-oxygen copper (C1020P), in any case is less than or equal to 3.1; this enables application as a carrier material.

The workpiece stage of a resist curing device in accordance with the invention is made of a special material and can be used for all devices in which a workpiece to which a resist has been applied is held on a workpiece stage by vacuum, and in which the resist is treated. One such device is, for example, a UV photoresist curing device as an in which the following method, as an advantageous example, is undertaken:

Current is supplied to a heating apparatus and the workpiece stage (a wafer treatment rack) heated by heat conduction;

The workpiece stage is cooled with cooling water by inflow of cooling water into cooling openings which are provided within the carrier; and The wafer seated on the carrier is subjected to temperature control by these heating and cooling devices.

The workpiece stage of a resist curing device according to the invention is advantageously used especially as a workpiece stage which corresponds to an increased diameter of the wafer of 300 mm. However, the invention is not limited thereto, and can be used as a workpiece stage which corresponds to all types of workpiece stages. The workpiece stage is not limited to the workpiece stage of the above described type either, and all workpiece stages can be used if they have a temperature control means which includes both a heating means and a cooling means.

As was described above, it is important in the invention that the carrier material be an aluminum alloy or a copper alloy which meets the condition that the value of $\sigma/\sigma_y$ is no more than 3.1. A suitable material can be used if the above described condition is met. According to the invention, the aluminum alloys and copper alloys shown in Table 1 are preferably used as the carrier material.

In the workpiece stage of the resist curing device, when the temperature is increased or decreased in the carrier, a temperature gradient is formed, by which local thermal stress arises. In this case, if the local thermal stress exceeds the fracture point (elastic limit) of the metal of the carrier, a residual local change of shape which becomes a warping of the carrier occurs. In particular, in the case of a workpiece stage which corresponds to a wafer with a large diameter of 300 mm, warping occurs due to the large temperature gradient, by which it becomes difficult to secure the wafer to the carrier surface by vacuum suction. The measure in accordance with the invention that a workpiece stage material with a value of $\sigma/\sigma_y$ of less than or equal to 3.1 is used, makes it possible for warping of the peripheral area to be fixed with respect to the middle area of the carrier at no more than 0.5 mm. In this way, it is possible to reliably secure the wafer on the surface of the workpiece stage by drawing a vacuum.

The following was established by the tests of the inventors:

The wafer can be secured on the carrier surface by drawing a vacuum, when the warp of the workpiece stage is less than or equal to 0.5 mm.

The above described condition is met when a carrier material with a value of $\sigma/\sigma_y$ of 3.1 or less is used. This material can be advantageously used as the carrier material.

These conditions were established in an area which is adapted to normal technical conditions which can be expected in the technical domain to which the workpiece stage of the resist curing device belongs.

The invention relates to a workpiece carrier of a resist curing device which is characterized in that the carrier is made of a material, specifically of an aluminum alloy or a copper alloy which meets the condition $\sigma/\sigma_y \leq 3.1$. An advantageous workpiece carrier which corresponds to the increase in the wafer diameter can be devised by such an arrangement.

As was described above, the invention is characterized in that in the workpiece stage of a resist curing device the carrier consists of a material, specifically of an aluminum alloy or a copper alloy which meets the condition $\sigma/\sigma_y \leq 3.1$. The invention yields the following effects:

(1) In a workpiece stage of a resist curing device, a large warping of the carrier can be reliably prevented despite repeated the temperature increases and decreases.

(2) By the measure that the material of a workpiece stage of a resist curing device is made of a material (for example, of an aluminum alloy A6061P or A5052P which meets the condition $\sigma/\sigma_y \leq 3.1$ is used, the warping of the peripheral area can be fix with respect to the middle area of the carrier 0.5 mm or less, even if, for example, the increase or decrease of temperature between 50° C. and 250° C. is repeated.

(3) A wafer with a large diameter of 300 mm can be reliably secured on the workpiece stage by vacuum suction. In this way, in a wafer with a large diameter, normal resist curing treatment can be done.

(4) A workpiece stage with high efficiency which corresponds to an increase in the wafer diameter can be offered.

What we claim is:

1. Workpiece stage of a resist curing device comprising a heating means, a cooling means and a vacuum suction means, the heating and cooling means cycling the temperature of the workpiece stage between 80 to 130° C. and 200 to 250° C. repeatedly, wherein the workpiece stage is of at least 300 mm in diameter and is made of a material which is chosen from the group consisting of an aluminum alloy and a copper alloy which meets the following condition:

$$\sigma/\sigma_y \leq 3.1,$$

where $\sigma$ is thermal stress as determined using the following formula:

$$\sigma = E\alpha\Delta T$$

where E is Young's modulus (N/mm$^2$) at 200° C., $\alpha$ is a coefficient of linear expansion (1/° C.) at 200° C. and $\Delta T$ is a temperature difference (° C.) of 120° C., and $\sigma_y$ is a fracture point at 200° C. for preventing warping of a peripheral area of the workpiece stage relative to a center area thereof by more than 0.5 mm for the workpiece stage due to the repeated cycling of said heating and cooling means.

2. Workpiece stage of a resist curing device as claimed in claim 1, wherein the material of the workpiece stage is an aluminum alloy A6061P.

3. Workpiece stage of a resist curing device as claimed in claim 1, wherein the material of the workpiece stage is an aluminum alloy A5052P.

* * * * *